(12) United States Patent
Bu et al.

(10) Patent No.: US 10,157,908 B2
(45) Date of Patent: *Dec. 18, 2018

(54) ELECTROSTATIC DISCHARGE DEVICES AND METHODS OF MANUFACTURE

(71) Applicant: INTERNATIONAL BUSINESS MACHINES CORPORATION, Armonk, NY (US)

(72) Inventors: Huiming Bu, Glenmont, NY (US); Junjun Li, Cupertino, CA (US); Theodorus E. Standaert, Clifton Park, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/606,000

(22) Filed: May 26, 2017

(65) Prior Publication Data

US 2017/0263601 A1 Sep. 14, 2017

Related U.S. Application Data

(60) Continuation of application No. 15/198,197, filed on Jun. 30, 2016, now Pat. No. 9,704,848, which is a
(Continued)

(51) Int. Cl.
*H01L 27/02* (2006.01)
*H01L 27/12* (2006.01)
(Continued)

(52) U.S. Cl.
CPC ........ *H01L 27/0296* (2013.01); *H01L 21/845* (2013.01); *H01L 27/0251* (2013.01);
(Continued)

(58) Field of Classification Search
None
See application file for complete search history.

(56) References Cited

U.S. PATENT DOCUMENTS 7,250,658 B2 7/2007 Doris et al.
7,560,784 B2 7/2009 Cheng et al.
(Continued)

OTHER PUBLICATIONS

Office Action from U.S. Appl. No. 15/826,953 dated Feb. 9, 2018, 7 pages.
(Continued)

*Primary Examiner* — Alexander Ghyka
(74) *Attorney, Agent, or Firm* — Steven J. Meyers; Andrew M. Calderon; Roberts Mlotkowski Safran Cole & Calderon, P.C.

(57) ABSTRACT

Electrostatic discharge (ESD) devices and methods of manufacture are provided. The method includes forming a plurality of fin structures and a mesa structure from semiconductor material. The method further includes forming an epitaxial material with doped regions on the mesa structure and forming gate material over at least the plurality of fin structures. The method further includes planarizing at least the gate material such that the gate material and the epitaxial material are of a same height. The method further includes forming contacts in electrical connection with respective ones of the doped regions of the epitaxial material.

12 Claims, 7 Drawing Sheets

Related U.S. Application Data continuation of application No. 14/882,724, filed on Oct. 14, 2015, now Pat. No. 9,425,184, which is a division of application No. 14/288,960, filed on May 28, 2014, now Pat. No. 9,281,303.

(51) Int. Cl.
  *H01L 21/84* (2006.01)
  *H01L 29/78* (2006.01)
  *H01L 29/66* (2006.01)

(52) U.S. Cl.
  CPC ...... *H01L 27/0259* (2013.01); *H01L 27/0266* (2013.01); *H01L 27/1211* (2013.01); *H01L 29/66795* (2013.01); *H01L 29/785* (2013.01)

(56) References Cited

U.S. PATENT DOCUMENTS

| | | | |
|---|---|---|---|
| 7,575,962 | B2 | 8/2009 | Cho et al. |
| 7,872,310 | B2 | 1/2011 | Abadeer et al. |
| 7,968,409 | B2 | 6/2011 | Seliskar |
| 8,409,936 | B2 | 4/2013 | Tsuchiya et al. |
| 8,592,263 | B2 | 11/2013 | Standaert et al. |
| 8,791,526 | B2 | 7/2014 | Yoon et al. |
| 8,823,101 | B2 | 9/2014 | Ohguro |
| 8,865,539 | B2 | 10/2014 | Chen et al. |
| 9,281,303 | B2 * | 3/2016 | Bu .......... H01L 27/0266 |
| 9,425,184 | B2 | 8/2016 | Bu et al. |
| 9,704,848 | B2 * | 7/2017 | Bu .......... H01L 27/0259 |
| 2006/0205174 | A1 | 9/2006 | Hshieh et al. |
| 2006/0273372 | A1 | 12/2006 | Voldman et al. |
| 2008/0206934 | A1 | 8/2008 | Jones et al. |
| 2011/0140166 | A1 | 6/2011 | Parthasarathy et al. |
| 2011/0163355 | A1 | 7/2011 | Tezuka et al. |
| 2011/0165738 | A1 | 7/2011 | Tezuka et al. |
| 2012/0220091 | A1 | 8/2012 | Challa et al. |
| 2012/0313170 | A1 | 12/2012 | Chang et al. |
| 2013/0193445 | A1 | 8/2013 | Dennard et al. |
| 2013/0285208 | A1 | 10/2013 | Standaert et al. |
| 2014/0092506 | A1 | 4/2014 | Ahsan et al. |
| 2015/0147867 | A1 | 5/2015 | Shieh et al. |
| 2015/0162411 | A1 | 6/2015 | Schulze et al. |
| 2015/0325572 | A1 | 11/2015 | Kangguo et al. |
| 2015/0348958 | A1 | 12/2015 | Bu et al. |
| 2016/0315076 | A1 | 10/2016 | Bu et al. |

OTHER PUBLICATIONS

List of IBM Patents or Patent Applications Treated as Related 1 page.

Specification "Electrostatic Discharge Devices and Methods of Manufacture" and Drawings in U.S. Appl. No. 15/826,953, filed Nov. 30, 2017, 24 pages.

Office Action from U.S. Appl. No. 15/826,953 dated Aug. 9, 2018, 7 pages.

* cited by examiner

ELECTROSTATIC DISCHARGE DEVICES AND METHODS OF MANUFACTURE

FIELD OF THE INVENTION

The invention relates to semiconductor structures and, more particularly, to electrostatic discharge (ESD) devices and methods of manufacture.

BACKGROUND

Electrostatic discharge is a phenomenon in which electrostatic charge flows into a semiconductor integrated circuit from an external source. In semiconductor applications, the electrostatic discharge can destroy the integrated circuit. For example, when the electrostatic discharge phenomenon occurs, an amount of electrostatic charge flows into or out of a semiconductor integrated circuit in a moment, resulting in an excessive current flow through the semiconductor integrated circuit device. In this situation, an excessive voltage flows through an internal circuit resulting in, for example, junction breakdown, line melting, oxide film dielectric breakdown, or the like, thereby destroying the semiconductor integrated circuit.

In order to prevent the semiconductor integrated circuit from breaking due to the electrostatic discharge phenomenon, an electrostatic discharge (ESD) device is commonly provided between an external terminal and an internal circuit of a semiconductor integrated circuit. The ESD device forms a bypass for the excessive current, thereby protecting the integrated circuit. There are many different types of ESD devices commonly employed, including current limiting elements for limiting a transient current flowing in a semiconductor integrated circuit, such as a diffused resistor and a polysilicon resistor. However, ESD devices are challenged for SOI finFET devices since Si thickness of the finFET devices cannot be increased as it competes with the process window of the replacement metal gate (RMG) flow.

SUMMARY

In an aspect of the invention, a method comprises forming a plurality of fin structures and a mesa structure from semiconductor material. The method further comprises forming an epitaxial material with doped regions on the mesa structure. The method further comprises forming gate material over at least the plurality of fin structures. The method further comprises planarizing at least the gate material such that the gate material and the epitaxial material are of a same height. The method further comprises forming contacts in electrical connection with respective ones of the doped regions of the epitaxial material.

In an aspect of the invention, a method comprises: forming a plurality of fin structures and a mesa structure from silicon on insulator material; forming a blocking material on the fin structures and the mesa structure; removing the blocking material from the mesa structure, exposing the silicon on insulator material of the mesa structure; growing an epitaxial material on the exposed silicon on insulator material of the mesa structure; implanting impurities into the epitaxial material with respective ion implantation processes for positive and negative impurities; forming gate material over at least the plurality of fin structures and the epitaxial material; planarizing the gate material and the epitaxial material to a same height; and forming contacts in electrical connection with respective ones of the doped regions of the epitaxial material.

In an aspect of the invention, a structure comprises: a mesa structure composed of silicon on insulator material; a fin region separate from the mesa structure with a plurality of fin structures composed of the silicon on insulator material; epitaxial material on the mesa structure; and a gate material over the plurality of fin structures, wherein the gate material and the epitaxial material on the mesa structure are of a same height.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the electrostatic discharge (ESD) devices, which comprises the structures of the present invention. In still further embodiments, a method in a computer-aided design system is provided for generating a functional design model of the ESD devices. The method comprises generating a functional representation of the structural elements of the ESD devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to electrostatic discharge (ESD) devices and methods of manufacture. More specifically, the present invention relates to thick ESD devices embedded within a gate structure process.

In a conventional replacement metal gate flow, a chemical mechanical polish step (CMP) exposes the gate structures after which dummy silicon gates are selectively etched out. The risk of exposing the ESD device during poly open CMP (POC) increases as the height of the ESD device is increased which could be catastrophic since the ESD device will get attacked during the dummy gate silicon etch. Advantageously, in the present invention, by placing the ESD device in the gate structure processes, it is now possible to increase the ESD device height after the POC step. In this way, the ESD device does not interfere with the POC process window. Also, by implementing the processes of the present invention, ESD height can be increased significantly, e.g., about 70-85 nm for current 14 nm SOI implementations; whereas, current, ESD device height for 14 nm SOI implementations is currently limited to about 30-45 nm.

In embodiments, the structure of the present invention comprises a planar region with an SOI slab (mesa) and a fin region separate from the planar region with a plurality of fins therein. An epitaxial material is provided substantially over the SOI slab (mesa), wherein a nitride liner contacts sidewalls of the SOI slab (mesa), and contacts the epitaxial material. In embodiments, the uncovered portion of the SOI slab (mesa) can be covered by an epitaxial film which is implanted with dopants and thereafter a high-k film and, in embodiments, gate material. The plurality of fins and the SOI slab (mesa), have substantially the same height, whereas the epitaxial material has substantially greater height than both, as described in more detail herein. After further processing, the epitaxial material and the gate material can have the same height, thereby effectively increasing the height of the ESD device, compared to conventional devices.

The ESD devices of the present invention can be manufactured in a number of ways using a number of different tools. In general, though, the methodologies and tools are used to form structures with dimensions in the micrometer and nanometer scale. The methodologies, i.e., technologies, employed to manufacture the ESD devices of the present invention have been adopted from integrated circuit (IC) technology. For example, the structures of the present invention are built on wafers and are realized in films of material patterned by photolithographic processes on the top of a wafer. In particular, the fabrication of the ESD devices of the present invention uses three basic building blocks: (i) deposition of thin films of material on a substrate, (ii) applying a patterned mask on top of the films by photolithographic imaging, and (iii) etching the films selectively to the mask.

Figure 1:
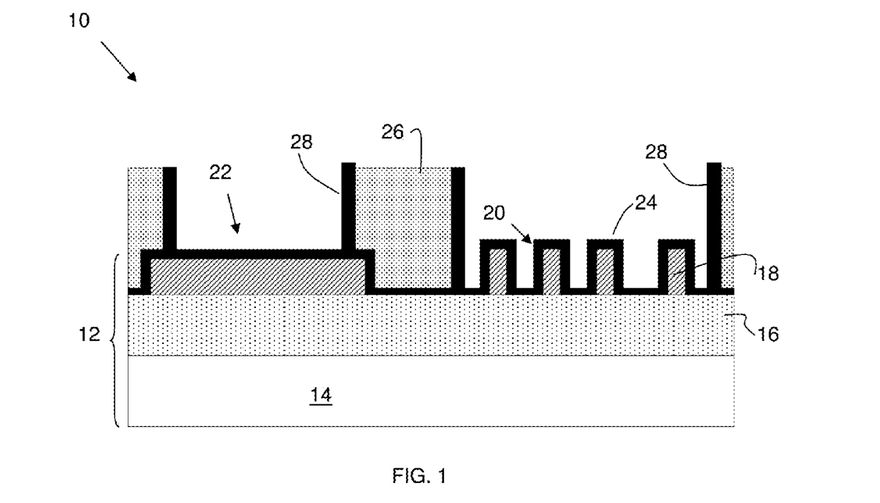
FIGS. 1-5, 6A-6C and 7-10 show structures and respective processing steps in accordance with aspects of the present invention.

FIG. 1 shows an intermediate structure formed on an SOI substrate, in accordance with aspects of the present invention. In particular, the structure 10 includes a silicon on insulator (SOI) substrate 12, comprising a substrate 14, buried oxide layer 16 and a semiconductor layer 18. In embodiments, the buried oxide layer 16 can be any insulator material, depending on the performance criteria of the device. The semiconductor layer 18 can be any semiconductor layer such as, for example, Si, SiGe, SiGeC, SiC, Ge alloys, GaAs, InAs, InP, and other III/V or II/VI compound semiconductors. In embodiments, the SOI substrate 12 can be formed using any conventional methods, e.g., bonding, SiMOX, etc.

FIG. 1 further shows a plurality of fin structures 20 and a mesa structure 22, both formed from the semiconductor layer 18 (with substantially the same height). In embodiments, the separated fin structures 20 and mesa structure 22 are SOI material formed using conventional etching processes, including sidewall image transfer (SIT) techniques. By way of example, in the SIT technique, a mandrel material, e.g., $SiO_2$, is deposited on the semiconductor layer (SOI) 18 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 20 and/or mesa structure 22. Spacers are formed on the sidewalls of the mandrels which are preferably material that is different than the mandrels, and which are formed using conventional deposition processes known to those of skill in the art. The spacers can have a width which matches the dimensions of the fin structures 20, for example. The mandrels are removed or stripped using a conventional etching process, selective to the mandrel material. An etching is then performed within the spacing of the spacers to form the sub-lithographic features. The sidewall spacers can then be stripped. In embodiments, the mesa 22 can also be formed during this or other conventional patterning processes, as contemplated by the present invention, e.g., by adding a photolithography step prior to transferring the sidewall spacers into the semiconductor layer.

A conformal oxide layer 24 is deposited on the fin structures 20 and mesa structure 22, using conventional deposition processes. For example, the conformal oxide layer 24 can be deposited using a conventional chemical vapor deposition (CVD) process or monolayer deposition (MLD) process. In embodiments, the conformal oxide layer 24 is a dummy or epitaxial oxide layer which will be removed in later processes. An oxide layer 26 (e.g., high density plasma oxide or flowable oxide (FOX)) and nitride sidewall 28 can be deposited, patterned and polished using conventional processes, e.g., deposition, lithography, and etching (reactive ion etching (RIE)) processes, to form the remaining structures of FIG. 1. More specifically, after forming of the oxide layer 24, dummy gate deposition and patterning is performed. Nitride spacers 28 are formed along with the extension and source/drain formation which may include (partial) epi growth on the fin structures 20 outside the gate regions and implantation steps. The structure is then covered by oxide 26, which can consist of HDP and flowable oxide. The structure is then planarized and the gates exposed by the POC process after which the dummy silicon is selectively etched out. The nitride sidewall 28 is in contact with the mesa structure 22 and the conformal oxide layer 24.

Figure 2:
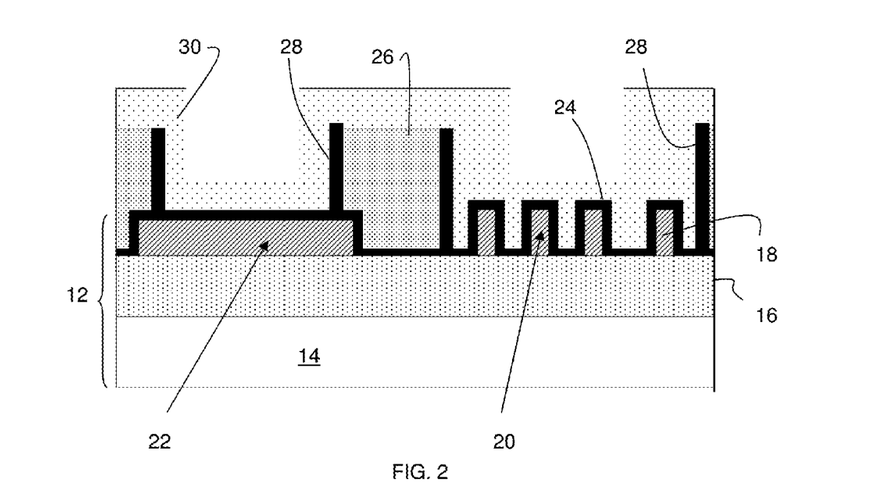

In FIG. 2, an oxide layer 30 is formed over the exposed surfaces of the structure shown in FIG. 1. In embodiments, the oxide layer 30 is a low quality sacrificial oxide film which can be deposited by a room temperature MLD process. In embodiments, the low quality oxide layer 30 can be deposited to a thickness of about 5 nm to about 20 nm, and preferably to a thickness of about 10 nm. In further embodiments, the low quality oxide layer 30 can have a high HF rate.

Figure 3:
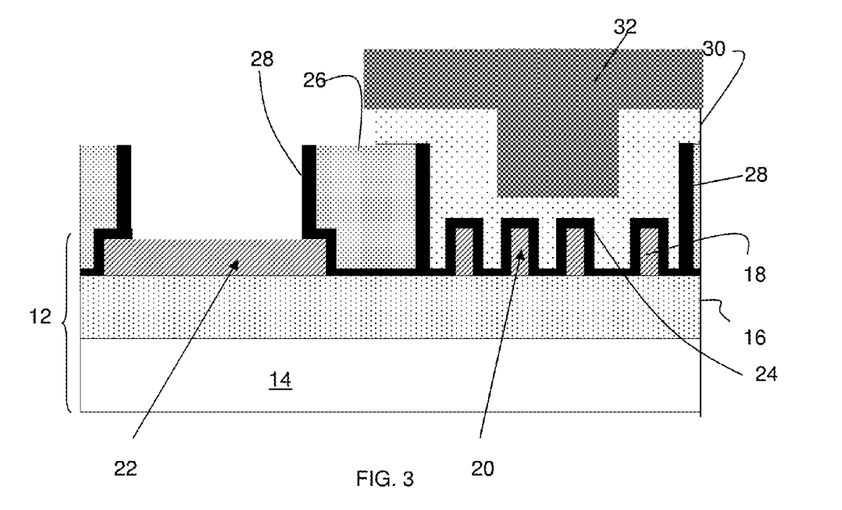

As shown in FIG. 3, a resist material 32 is formed over the structure, and patterned to protect the fin structures 20. More specifically, after a deposition of the resist material 32, the photoresist material 32 is exposed to a pattern of light and developed to form the pattern provided in FIG. 3. After the patterning, the unprotected areas of the low quality oxide layer 30 and conformal oxide layer 24, e.g., over the mesa structure 22, are removed by an etching process. In embodiments, the etching process can be a conventional Hydrogen Fluoride (HF) etch, followed by a sulfuric peroxide (SP) process to strip the resist material 32. The strip process is then followed by a preclean process to remove any remaining oxide from the mesa 22. The preclean process can be for example a SiCoNi etch or a wet HF step. In this way, the semiconductor material 18 of the mesa structure 22 will be exposed and cleaned for subsequent processing.

Figure 4:
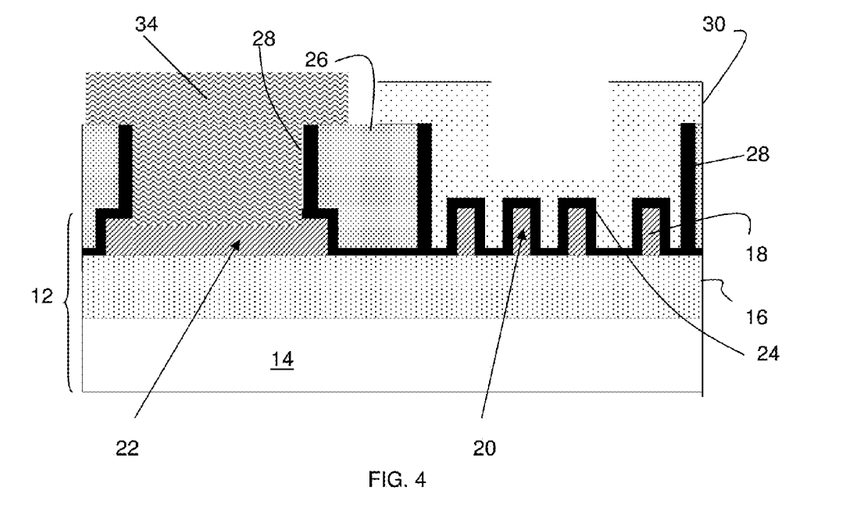

In FIG. 4, an epitaxial material 34 can be grown on the mesa structure 22 and, more particular, on the cleaned semiconductor material 18. In embodiments, the epitaxial material 34 can be crystalline Si based material (e.g., Si or SiGe) or poly material grown to different heights, depending on the gate height. For example, the present invention contemplates a height of 75 nm for the epitaxial material 34.

Figure 5:
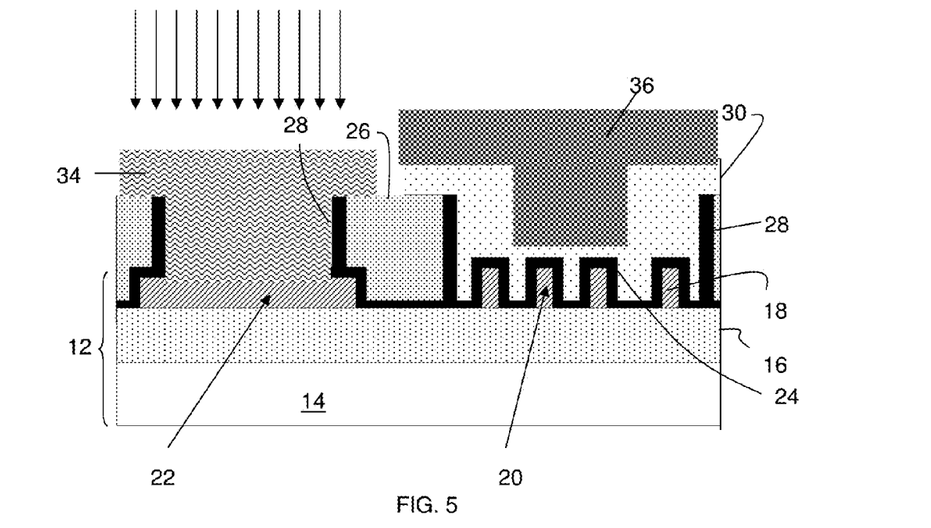

As further shown in FIG. 5, a mask 36 is formed over the fin structures 20 and an ion implantation process is performed on the exposed portions of the epitaxial material 34. In embodiments, the ion implantation process is a N-implantation process. For example, in embodiments, the epitaxial material 34 can be implanted with an n-type impurity such as phosphorous, arsenic, antimony, bismuth, etc. In embodiments, for example, the implant conditions for arsenic may be 5.0e12/25 keV; although other conditions and implants are contemplated by the present invention. In subsequent steps, the mask 36 can be removed.

Figure 6A:
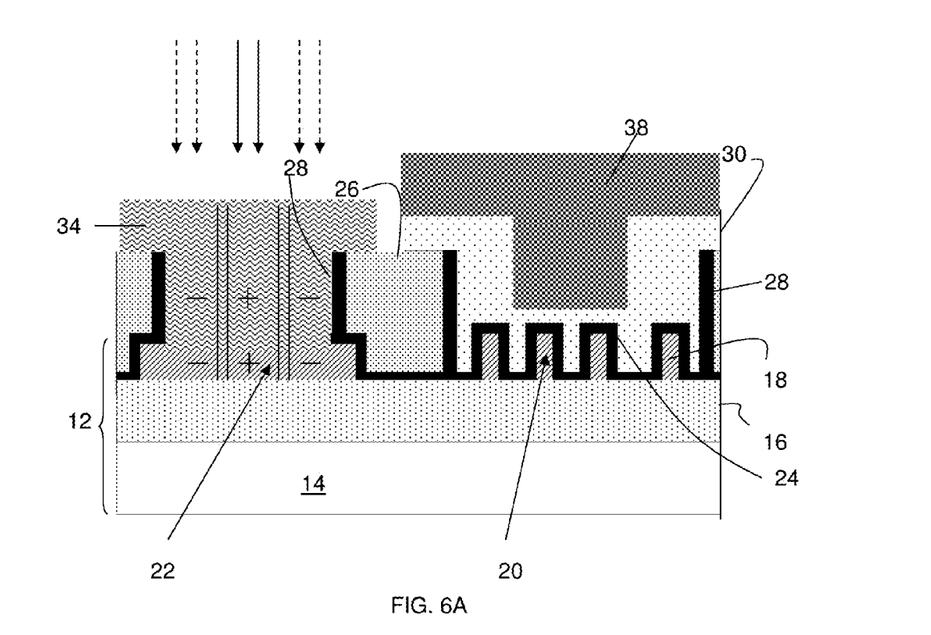
Figure 6B:
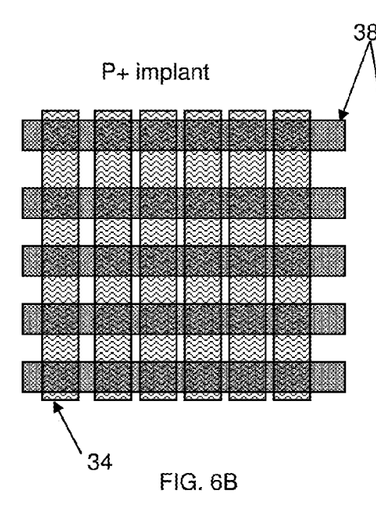
Figure 6C:
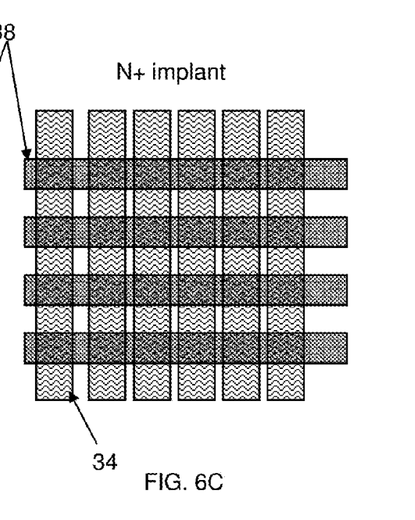

FIGS. 6A-6C show ion implantation processes according to aspects of the present invention. FIG. 6A is a cross sectional view of the structure; whereas, FIGS. 6B and 6C show top views of the structure showing placement of the masks 38 for different ion implantation processes. In the processes represented by FIGS. 6A-6C, the epitaxial material 34 and mesa structure 22 can be doped with P+ and N+ implants, during different implantation processes. For example, while protecting P+ areas with mask 38, the N+ areas can be implanted with phosphorous under the following conditions: 1.0e15/10 keV. Similarly, while protecting N+ areas with mask 38, the P+ areas can be implanted with $BF_2$ under the following conditions: $BF_2$ 1.0e15/15 keV. As should be understood by those of skill in the art, after each implant process, the respective mask 38 can be removed using conventional processes, as described herein. Also, these implant processes can take any order and are provided at an energy level such that they will implant into the mesa structure 22.

Figure 7:
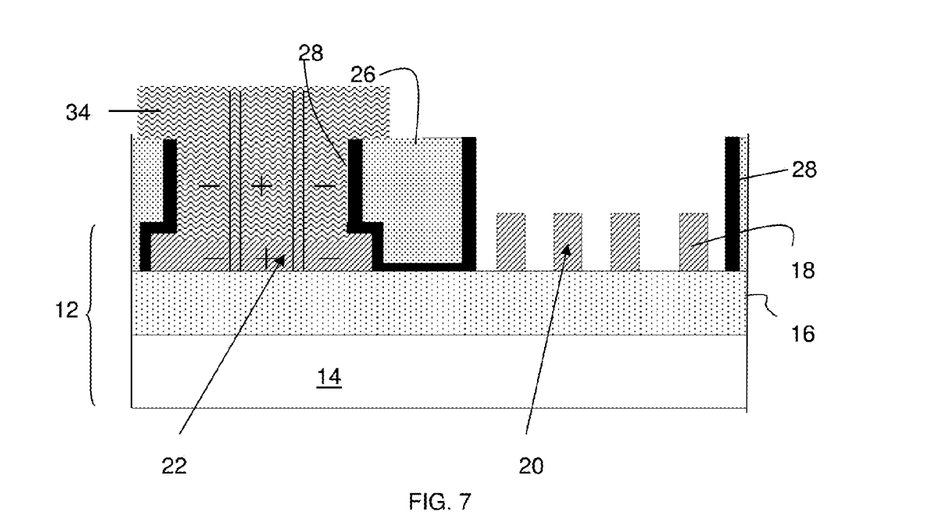

As shown representatively in FIG. 7, remaining portions of the low quality oxide layer and the oxide film over the fin structures 20 can be removed. This can then be followed by a cleaning of the exposed semiconductor material 18 of the fin structures 20.

Figure 8:
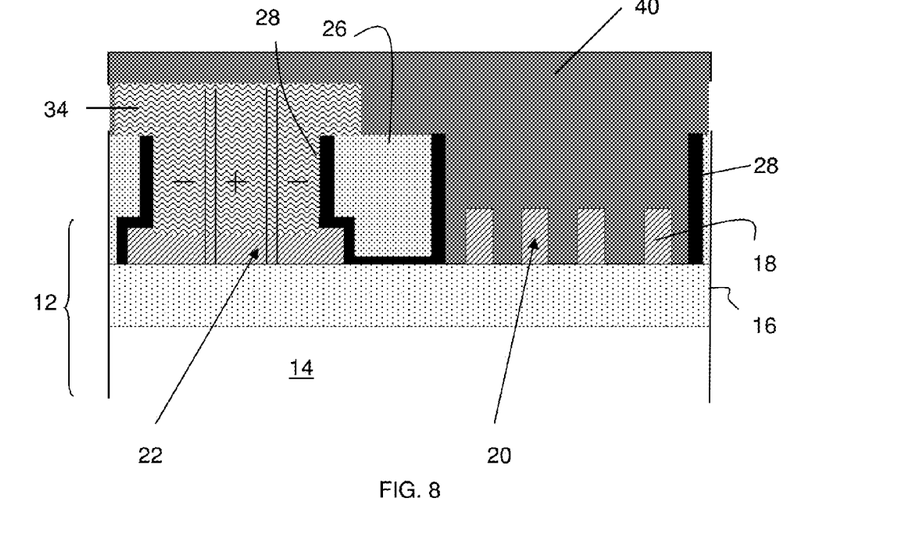

In FIG. 8, a gate stack 40 is deposited over the fin structures 20 and epitaxial material 34. In embodiments, the gate stack 40 can include any gate stack material. For example, the gate stack 40 can include different metals for a Pfet and Nfet, with different work function metals. By way of more specific example, gate stack 40 can include a dielectric material, e.g., hafnium based high-k dielectric material ($HfO_2$) or other oxide based materials, followed by the deposition of work function metals, aluminum, tungsten or polysilicon as examples.

Figure 9:
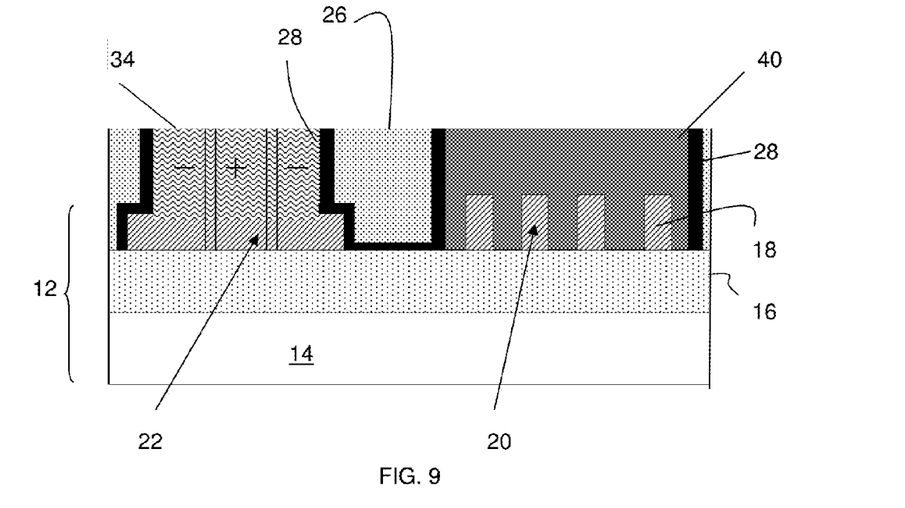

In FIG. 9, the gate stack 40 and ion implanted epitaxial material 34 can be planarized using conventional CMP processes. In this way, the gate stack 40 and ion implanted epitaxial material 34 can have a same height. By forming the gate stack 40 after the ion implanted epitaxial material 34, it is now possible to significantly increase the height of the ESD device (formed from the ion implanted epitaxial material 34), e.g., about 70-85 nm for current 14 nm SOI implementations; compared to ESD device height for 14 nm SOI implementations in currently known implementations, e.g., about 30-45 nm.

Figure 10:
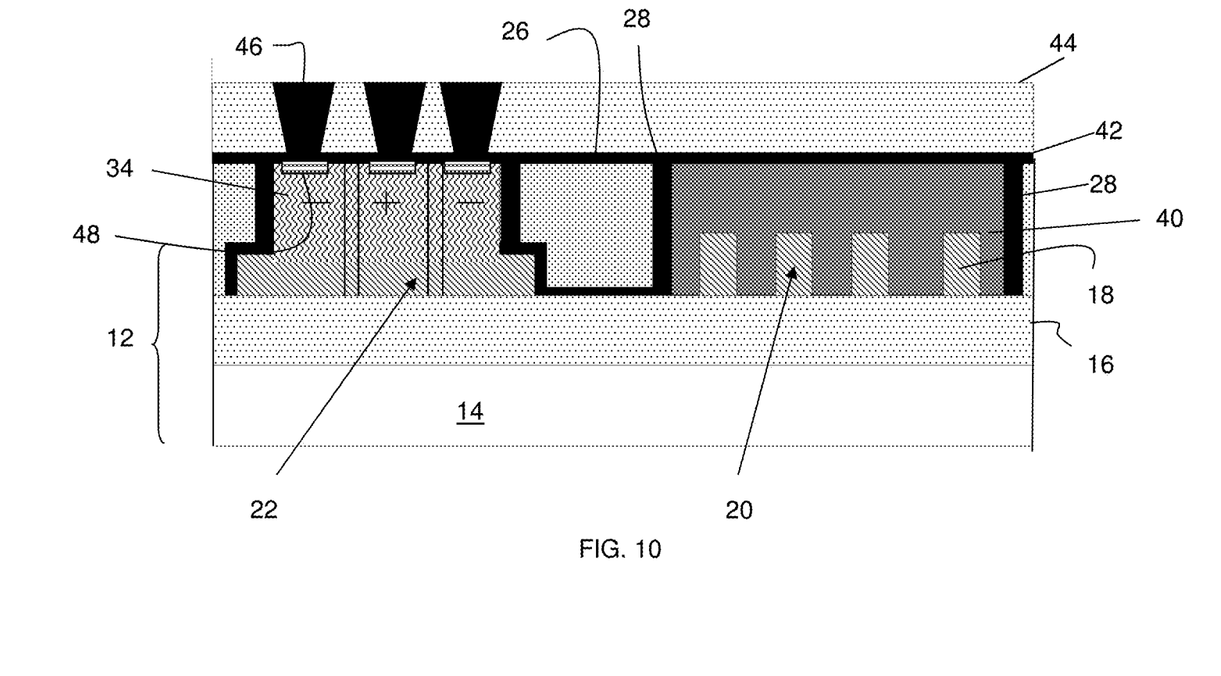

As shown in FIG. 10, an optional blocking layer, e.g., nitride, 42 is deposited on the planarized surface of the gate stack 40 and ion implanted epitaxial material 34. An insulating layer 44, e.g., oxide, is deposited on the blocking layer 42. The insulating layer 44 can be deposited using any conventional deposition process including, for example, CVD or plasma enhanced CVD (PECVD). Contacts 46 are formed in the insulating layer 44, contacting the respectively doped regions of the ion implanted epitaxial material 34.

In embodiments, the contacts 46 are formed by conventional lithography, etching and deposition processes. For example, after patterning of a resist, openings can be formed in the insulating layer 44 using a conventional RIE process, with appropriate etch chemistries. A tungsten material can then be deposited within the openings, followed by a planarization process to form the contacts 46.

Silicide regions 48 are formed at the junction of the contacts 46 and the respective ion implanted regions of the epitaxial material 34. These silicide regions 48 can be formed through the contacts, using conventional annealing processes. Wiring can then be formed in electrical connection with the contacts 44 (as also represented by reference numeral 44).

Figure 11:
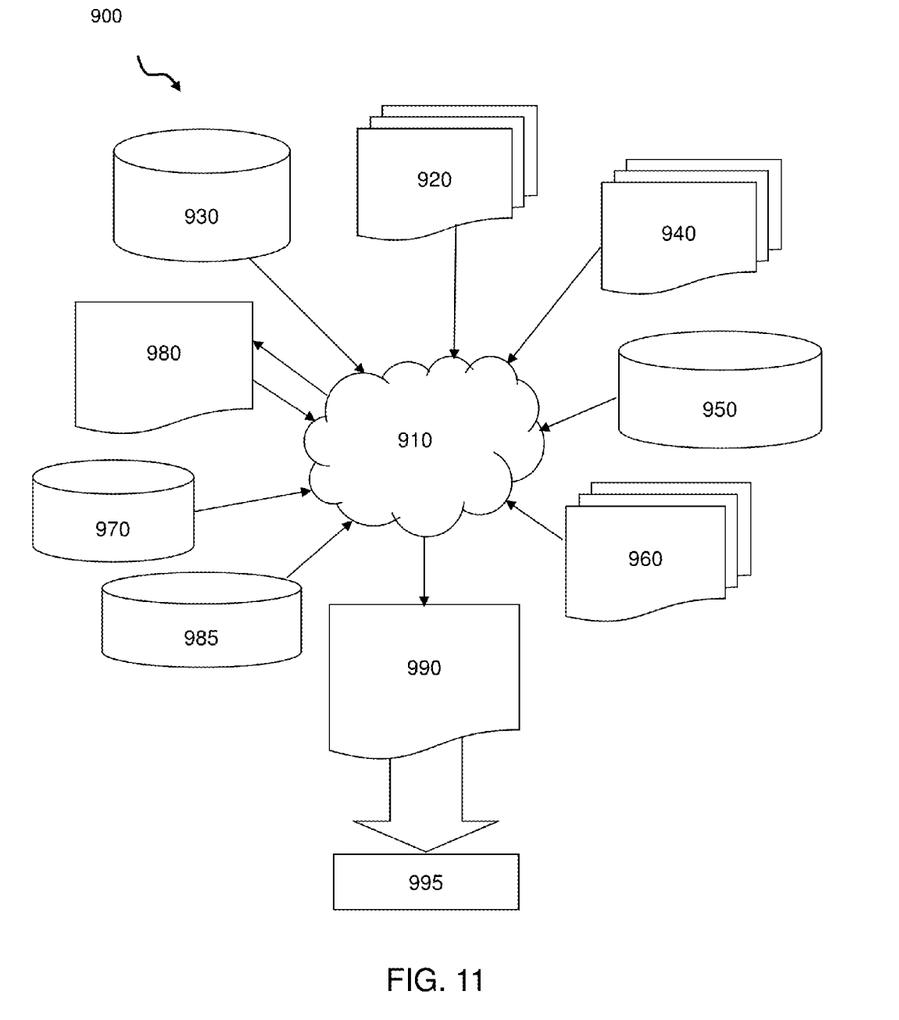
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
an electrostatic discharge (ESD) device comprising a mesa on an insulator layer and a epitaxial material on the mesa;
a plurality of fin structures on the insulator layer and composed of a same material as the mesa;
a gate stack on the plurality of fin structures.
2. The semiconductor structure of claim 1, wherein the gate stack and the epitaxial material on the mesa are of a same height.

3. The semiconductor structure of claim 2, wherein the epitaxial material has a greater height than the plurality of fin structures.

4. The semiconductor structure of claim 1, wherein the mesa and the plurality of fin structures are each composed of semiconductor material.

5. A semiconductor structure, comprising:
- an electrostatic discharge (ESD) device comprising a mesa on an insulator layer and a epitaxial material on the mesa;
- a plurality of fin structures on the insulator layer and composed of a same material as the mesa;
- a gate stack on the plurality of fin structures; and
- an oxide layer between the gate stack and the epitaxial material.

6. The semiconductor structure of claim 5, wherein top surfaces of the oxide layer, the gate stack, and the epitaxial material are planarized to a same height.

7. The semiconductor structure of claim 1, wherein the epitaxial material is a grown crystalline material.

8. A semiconductor structure, comprising:
- an electrostatic discharge (ESD) device comprising a mesa on an insulator layer and a epitaxial material on the mesa;
- a plurality of fin structures on the insulator layer and composed of a same material as the mesa; and
- a gate stack on the plurality of fin structures,
- wherein the epitaxial material is doped with N+ and P+ implants.

9. The semiconductor structure of claim 8, wherein the epitaxial material comprises an N+ area and a P+ area.

10. The semiconductor structure of claim 1, wherein the gate stack comprises a hafnium based high-k dielectric material and a work function material.

11. The semiconductor structure of claim 5, wherein the gate stack comprises a hafnium based high-k dielectric material and a work function material.

12. The semiconductor structure of claim 8, wherein the gate stack comprises a hafnium based high-k dielectric material and a work function material.

* * * * *